United States Patent
Montfort et al.

(10) Patent No.: US 7,660,143 B2
(45) Date of Patent: Feb. 9, 2010

(54) MULTIBIT ROM MEMORY

(75) Inventors: Olivier Montfort, Grenoble (FR);
Sébastien Gaubert, Brignoud (FR);
Philippe Beliard, Le Sappey En Chartreuse (FR)

(73) Assignee: Dolphin Integration, Meylan (FR)

( * ) Notice: Subject to any disclaimer, the term of this patent is extended or adjusted under 35 U.S.C. 154(b) by 112 days.

(21) Appl. No.: 12/101,266

(22) Filed: Apr. 11, 2008

(65) Prior Publication Data
US 2008/0253162 A1 Oct. 16, 2008

(30) Foreign Application Priority Data
Apr. 13, 2007 (FR) .................................. 07 54442

(51) Int. Cl.
*G11C 17/12* (2006.01)
(52) U.S. Cl. .......................... 365/104; 365/94; 365/103
(58) Field of Classification Search .................. 365/94, 365/103, 104
See application file for complete search history.

(56) References Cited
U.S. PATENT DOCUMENTS

| 5,870,326 | A | 2/1999 | Schuelein | |
| 6,002,607 | A | 12/1999 | Dvir | |
| 6,636,434 | B2 * | 10/2003 | Poullet | 365/94 |
| 2003/0086305 | A1 * | 5/2003 | Poullet | 365/200 |
| 2005/0018465 | A1 * | 1/2005 | Jeung et al. | 365/94 |
| 2005/0213362 | A1 * | 9/2005 | Chang | 365/104 |
| 2006/0215436 | A1 * | 9/2006 | Jeung et al. | 365/94 |

FOREIGN PATENT DOCUMENTS

| FR | 2 749 434 | 12/1997 |
| FR | 2 826 170 | 12/2002 |

* cited by examiner

*Primary Examiner*—Amir Zarabian
*Assistant Examiner*—Jay Radke
(74) *Attorney, Agent, or Firm*—Howard IP Law Group, PC

(57) ABSTRACT

The invention concerns a ROM comprising a set of memory points arranged in rows and columns, each memory point capable of storing two bits of data and comprising a single switch controllable to connect together first and second terminals of said switch, each of said first and second terminals being connected to one of first, second and third conductive lines, wherein said switch is connected via said first and second terminals between said first and second lines to encode a first data value, between said first and third lines to encode a second data value, between said second and third lines to encode a third data value, and both of said first and second terminals being connected to the same one of said first, second and third lines to encode a fourth data value.

10 Claims, 1 Drawing Sheet

MULTIBIT ROM MEMORY

FIELD OF THE INVENTION

The present invention relates to the field of memory devices, and in particular to a Read Only Memory (ROM) device.

BACKGROUND TO THE INVENTION

FIG. 1 illustrates one possible approach to providing a ROM circuit. Such a circuit encodes data according to the position of lines connected to the main current terminals of a transistor. Four transistors T are illustrated in FIG. 1 and two lines A and B are provided according to this scheme. Each transistor is able to store one bit of data. In this particular encoding scheme, a "0" is encoded by connecting both of the main current terminals of a transistor to the same line, while a "1" is encoded by connecting the main current terminals of a transistor to different lines. According to this coding scheme, adjacent transistors share a common main current terminal connection, thus reducing the number of connections necessary. This is possible as encoding is based on the connection of one main current terminal of a transistor when compared to the other, rather than on the actual connection of each terminal.

FIG. 2 illustrates an alternative circuit arrangement as described in U.S. Pat. No. 6,636,434, assigned to the assignee herein. Such a circuit allows two bits to be encoded by each transistor in the circuit. Four lines A, B, C and D are provided in this embodiment, and again adjacent transistors share a common main current terminal connection. In this embodiment a coding scheme is used as shown in the following table:

TABLE 1

| Data | Drain/source connections of the MOS transistor | | | |
|------|----|----|----|----|
| 00 | AB | BA | CD | DC |
| 01 | AD | BC | CB | DA |
| 10 | AC | BD | CA | DB |
| 11 | AA | BB | CC | DD |

Such coding schemes described above require two lines per bit of data that can be encoded. It is generally desirable to reduce the number of lines in such circuits where possible, to reduce the area of the memory, and manufacturing costs.

SUMMARY OF THE INVENTION

According to a first aspect of the present invention, there is provided a ROM device comprising a set of memory points arranged in rows and columns, each memory point capable of storing two bits of data and comprising a single switch controllable to connect together first and second terminals of the switch, each of the first and second terminals being connected to one of first, second and third conductive lines, wherein the switch is connected via the first and second terminals between the first and second lines to encode a first data value, between the first and third lines to encode a second data value, between the second and third lines to encode a third data value, and both of the first and second terminals being connected to the same one of the first, second and third lines to encode a fourth data value.

According to one embodiment of the present invention, the first terminal of the switch is connected to one of the first and third lines, and the second terminal of the switch is connected to one of the second and third data lines, wherein the connection of each of the first and second terminals stores one of the two bits of data.

According to a further embodiment of the present invention, each switch is a MOS transistor.

According to a further embodiment of the present invention, the gates of the MOS transistors of a same row are interconnected.

According to a further embodiment of the present invention, the first terminal is a drain terminal and the second terminal is a source terminal.

According to a further aspect of the present invention, a memory reading circuit is provided for reading the above ROM device, the circuit comprising a first switch arranged to connect the first line to one of a first output node and a first voltage level; a second switch arranged to connect the second line to one of a second output node and the first voltage level; and precharging means arranged to store a second voltage level on a selected one of the first and second lines.

According to a further embodiment of the present invention, the memory reading circuit comprises a first NOT gate connected between the first line and the first output node and a second NOT gate connected between the second line and the second output node.

According to a further aspect of the present invention, a method of encoding data in a ROM device is provided, wherein the ROM device includes memory points arranged in rows and columns, each column further comprising three conductive lines, each memory point storing two bits of data and comprising a controllable switch comprising first and second main terminals, the method comprising independently connecting the first and second terminals to the first, second and third lines to encode the data, wherein connecting the first terminal to the first line and the second terminal to the second line encodes a first data value; connecting the first terminal to the first line and the second terminal to the third line encodes a second data value; connecting the first terminal to the second line and the second terminal to the third line encodes a third data value; and connecting the first and second terminals to a same one of the first, second and third lines encodes a fourth data value.

According to an embodiment of the present invention, each switch is a MOS transistor, the first terminal is a drain terminal and the second terminal is a source terminal, and the source and drain of each memory point is encoded according to the following exemplary table, wherein the first, second and third lines are designated A, B and C respectively:

| Drain | Source | Bit |
|-------|--------|-----|
| A | B | 00 |
| A | C | 01 |
| C | B | 10 |
| C | C | 11 |

The bit value 00 is encoded by connecting one of the drain and source terminals to one of the lines A and B and the other of the drain and source terminals to the other of the lines A and B. The bit value 01 is encoded by connecting the drain terminal to one of the lines A and B and the source terminal to the line C. The bit value 10 is encoded by connecting the drain terminal to the line C and the source terminal to one of the lines A and B. The bit value 11 is encoded by connecting both of the drain and source terminals to the line C. In an alternative embodiment, the bit value 11 is encoded by connecting both of the drain and source terminals to any one of the lines A and B.

According to a further aspect of the present invention, there is provided a method of decoding data from a ROM device comprising a set of memory points arranged in rows and columns, each memory point capable of storing two bits of data and comprising a single switch controllable to connect together first and second terminals of the switch, each of the first and second terminals being connected to one of first, second and third conductive lines, the method comprising connecting the second and third lines to a first voltage level; storing a second voltage level on the first line; activating one of the memory points; and detecting the voltage on the first line and determining a first bit of the data based on only the voltage detected on the first line. In other words, the voltage on other lines need not be detected as they are not used to determine the first bit of data.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings.

DETAILED DESCRIPTION OF THE DRAWINGS

Figure 1:
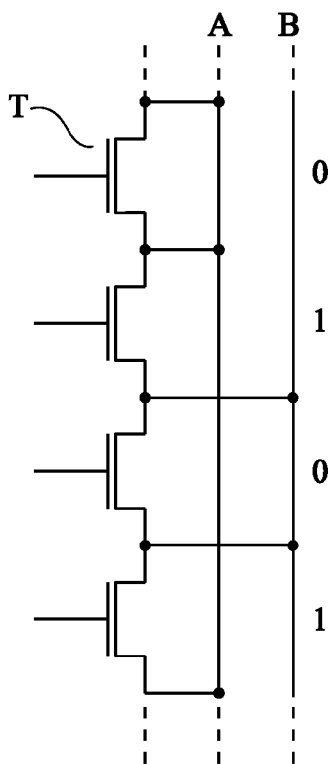
FIG. 1 illustrates a circuit for storing single bits of data.
Figure 2:
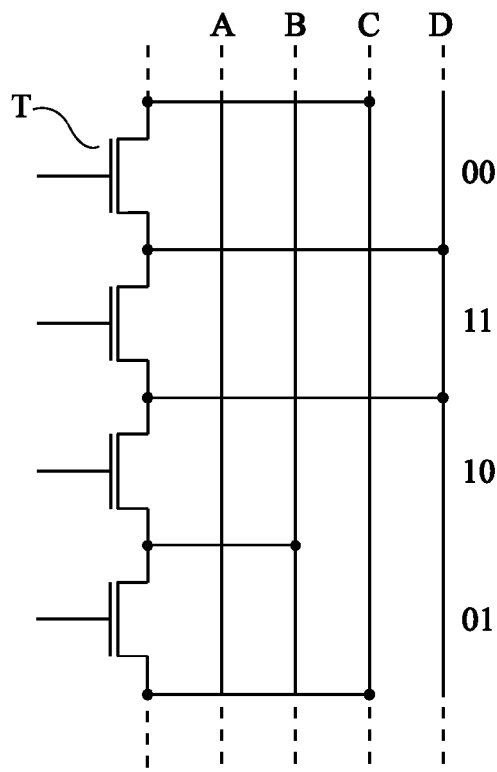
FIG. 2 illustrates a circuit for storing pairs of data bits using four lines.
Figure 3:
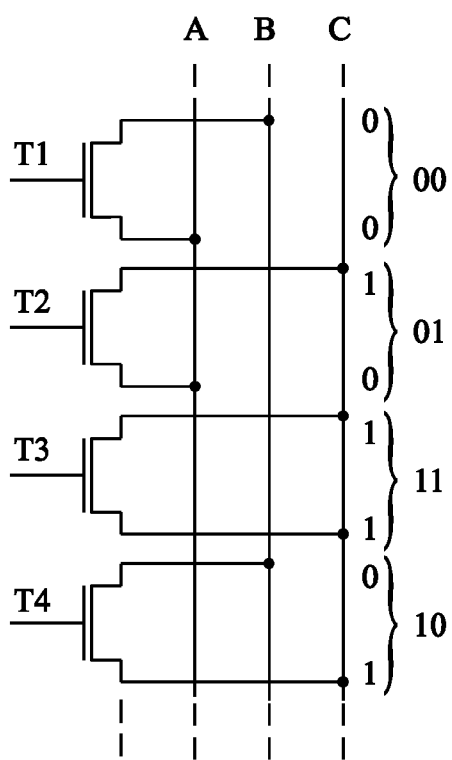
FIG. 3 illustrates a memory circuit according to an embodiment of the present invention.

FIG. 3 illustrates an embodiment of a ROM device. As shown, the memory circuit comprises three lines A, B and C, each, for example, formed of a conducting track in a layer of an integrated circuit. In this example, MOS transistors are used to store information, based on the connection of each of their main current terminals to one of lines A, B and C. Four such transistors $T_1$ to $T_4$ are illustrated in FIG. 3. In this embodiment, the source and drain of the MOS transistor may be independently connected to the memory lines A, B and C, rather than having a connection that is common with an adjacent transistor, as is the case with the circuits illustrated in FIGS. 1 and 2.

In this embodiment, the following table is used to encode the bit data, and shows the two-bit value encoded depending on the connection of the drain and source of each transistor:

TABLE 2

| Drain | Source | Bit |
|---|---|---|
| A | B | 00 |
| A | C | 01 |
| C | B | 10 |
| C | C | 11 |

Thus, as illustrated, according to this embodiment the drain of the MOS transistor may be connected to lines A or C, while the source of this MOS transistor may be connected to lines B or C. Line C can be considered to designate a "1", and lines A and B a "0", and thus if neither the source nor the drain is connected to line C, "00" is encoded. However, when both lines are connected to line C, "11" is encoded, when the source is connected to line C and the drain to line A, "01" is encoded, and when the drain is connected to line C and the source to line B, "10" is encoded. In this way, the source and drain of each MOS transistor can be considered as independently storing respective bits of data. An example of the connection of the drain and source of each transistor for each of the above data values "00", "01", "10" and "11" are illustrated in FIG. 3.

In alternative embodiments, "11" may be encoded not only by connecting both source and drain to line C, but also by connecting both the source and drain to one of the other lines, in other words, to line A or line B.

Figure 4A:
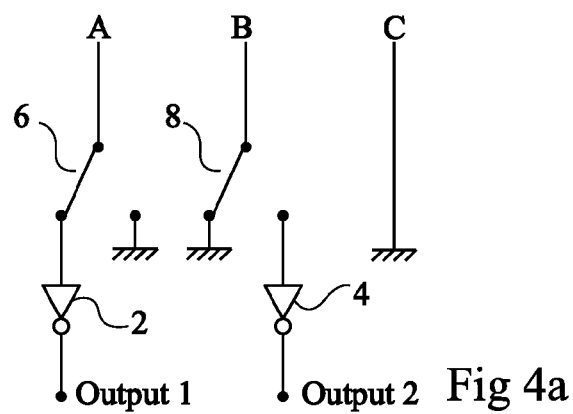
FIGS. 4A and 4B illustrate decoding circuitry according to an embodiment of the present invention.
Figure 4B:
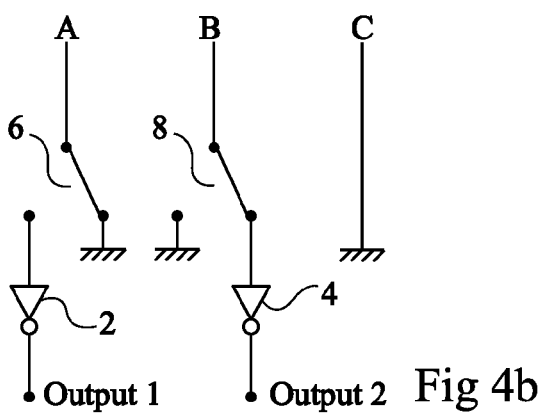

FIGS. 4A and 4B illustrate circuitry for decoding the data bits stored in the memory of FIG. 3. As illustrated in these figures, circuitry is provided including two NOT gates 2, 4 and two switches 6, 8. Switches 6, 8 are connected to lines A and B of the memory. Line C of the memory is connected to ground. Each switch 6, 8 allows lines A and B respectively to be connected to the input node of the respective NOT gate 2, 4, or to a ground node.

In a first state of the decode circuitry shown in FIG. 4A, switch 6 is controlled to connect line A to NOT gate 2, and switch 8 is controlled to connect line B to ground. In this configuration, the information stored on the drain of the MOS transistor can be determined, and in particular it can be determined whether or not the drain of the MOS transistor is connected to line A.

Line A is then precharged to a preset voltage level, which is different to the ground voltage. For example, assuming a ground voltage of 0 V, line A is precharged to 3 V. Precharging is, for example, performed using a further switch, not shown in the figures, which allows a capacitor or similar charge storing means to be connected to the line to precharge it, and then disconnected from the line.

The transistor to be tested is then activated by providing a voltage to its gate node. The connection of the drain of the transistor is then indicated by the signal at the output of NOT gate 2, which is connected to a first output node labelled "output 1" of the decode circuitry. Decoding is based on the principle that the source of the transistor is connected to lines B or C, which are at ground voltage, and therefore if the drain is connected to line A, the voltage on line A will be discharged, but if the drain in not connected to line A, the precharge voltage will remain on line A. Thus, if the voltage at output node "output 1" is at approximately the precharge voltage, for example greater than 2 V, this indicates that the drain is not connected to line A, whereas if this output is at the ground voltage, for example 0V, this indicates that the drain of the transistor is connected to line A.

With reference to FIG. 4B, in order to determine the connection of the source of the transistor, and in particular whether or not it is connected to line B, the decode circuitry is then switched such that switch 6 connects line A to ground, while switch 8 connects line B to NOT gate 4. Line B is then connected to a precharge voltage, which is again a voltage level different to the ground voltage, for example 3V. The transistor to be tested is then activated by providing a voltage to its gate terminal.

Decoding of the bit associated with the source of the transistor is based on the principle that the drain is connected to either line A or line C, which have been connected to ground. Therefore, if the source is connected to line B, the voltage stored on line B will be discharged upon activation of the transistor, whereas if the source is connected to line C, the voltage on line B will not be discharged. The connection of the source is indicated by the signal at the output node of not gate 4, which provides a second output, labelled "output 2", of the decode circuitry. In particular, if this output is at approximately the precharge voltage, for example greater than 2 V, this indicates that the source is not connected to line B, whereas if the output is at the ground voltage, this indicates that the source is connected to line B.

Outputs 1 and 2 from the decode circuitry thus provide the data decoded from the ROM. Assuming that the precharge voltages used to precharge lines A and B are at the level of a logic high, and that a logic low corresponds to the ground voltage, these outputs can directly provide the data bits stored by the each transistor in the ROM.

The above decoding steps can be repeated for each transistor in the ROM device, and one row of transistors in the ROM device may be decoded at the same time, and rows decoded sequentially. For example, gates of the transistors in a row are connected together such that rows of transistors can be activated at the same time.

It will be apparent that such decode circuitry does not in fact distinguish between the source and drain connections, in other words a source of a transistor connected to line A and drain to line B will be read with the same result as if the source of the transistor were connected to line B and the drain to line A. Therefore, according to a more general coding scheme, encoding is performed based on the lines connected by the transistors. In other words, a first data value is encoded by connecting a transistor between lines A and line B, a second data value is encoded by connecting a transistor between lines B and line C, a third data value is encoded by connecting a transistor between lines A and line C, and a fourth data value is encoded by connecting both terminals of a transistor to the same line.

Thus a ROM device has been described in which two bits of data may be encoded using only three lines. Switches, for example transistors, in the memory are each used to encode two bits of data. Each switch comprises two main current terminals, and a control terminal or gate, and data is stored based on the connection of each of the main current terminals of the switch.

Whilst a specific example of an encoding technique has been described, it would be obvious to those skilled in the art that many variations and modifications can be applied. In particular, while according to the above embodiments a particular example of the data values encoded by each connection has been described, in alternative encoding schemes, each of the connections of the switch could be used to encode a different one of the data values. For example both terminals of the switch connected to the same line could encode "01", a connection to the first and third lines could encode "11", a connection of the second and third lines could encode a "00", and a connection of the first and second lines could encode a "10". In this case the decode circuitry can include some simple additional logic to convert the output signals to give the correct data.

Lines A, B and C are for example formed as conductive tracks in a layer of an integrated circuit structure, and connections of the switch to these lines are for example formed by vias, although other arrangements are possible. The conducting tracks for forming the lines are for example formed of copper, or alternative metals or metal alloys.

Furthermore, while embodiments have been described using MOS transistors, in alternative embodiments other types of transistors or switches could be used, such as bipolar transistors.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended to be limiting. The invention is limited only as defined in the following claims and the equivalent thereto.

The invention claimed is:

1. A Read-Only Memory (ROM) device comprising a set of memory points arranged in rows and columns, each memory point capable of storing two bits of data and comprising a single switch controllable to connect first and second terminals of said switch, each of said first and second terminals being connected to one of first, second and third conductive lines, independent of the terminal connections of switch of the other memory points, wherein said switch is connected via said first and second terminals between said first and second lines to encode a first data value, between said first and third lines to encode a second data value, between said second and third lines to encode a third data value, and both of said first and second terminals being connected to the same one of said first, second and third lines to encode a fourth data value.

2. The ROM device of claim 1, wherein said first terminal of said switch is connected to one of said first and third lines, and said second terminal of said switch is connected to one of said second and third data lines, wherein the connection of each of said first and second terminals stores one of said two bits of data.

3. The ROM device of claim 1, wherein each switch is a MOS transistor.

4. The ROM device of claim 1, wherein the gates of the MOS transistors of a same row are interconnected.

5. The ROM device of claim 3, wherein said first terminal is a drain terminal and said second terminal is a source terminal.

6. A memory reading circuit for reading a ROM device, wherein
said ROM device comprises a set of memory points arranged in rows and columns, each memory point capable of storing two bits of data and comprising a single switch controllable to connect together first and second terminals of said switch, each of said first and second terminals being connected to one of first, second and third conductive lines, said memory reading circuit comprising:
a first switch arranged to connect said first line to one of a first output node and a first voltage level;
a second switch arranged to connect said second line to one of a second output node and said first voltage level; and
precharging means arranged to store a second voltage level on a selected one of said first and second lines.

7. The memory reading circuit of claim 6 further comprising a first NOT gate connected between said first line and said first output node and a second NOT gate connected between said second line and said second output node.

8. A method of encoding data in a ROM device, comprising memory points arranged in rows and columns, each column further comprising three conductive lines, each memory point storing two bits of data and comprising a controllable switch comprising first and second main terminals, said method comprising:
connecting said first and second terminals to said first, second and third lines to encode said data, independent of the terminal connections of switch of the other memory points, wherein connecting said first terminal to said first line and said second terminal to said second line encodes a first data value;

connecting said first terminal to said first line and said second terminal to said third line encodes a second data value;

connecting said first terminal to said second line and said second terminal to said third line encodes a third data value; and connecting said first and second terminals to a same one of said first, second and third lines encodes a fourth data value.

9. The method of claim 8 wherein each switch is a MOS transistor, said first terminal is a drain terminal and said second terminal is a source terminal, and the source and drain of each memory point is encoded according to the following relationships, wherein the first, second and third lines are designated A, B and C respectively, and wherein a bit value 00 is encoded by connecting said drain and source terminals to said lines A and B respectively;

a bit value 01 is encoded by connecting said drain and source terminals to said lines A and C respectively;

a bit value 10 is encoded by connecting said drain and source terminals to said lines C and B respectively; and a bit value 11 is encoded by connecting both of said drain and source terminals to only one of said lines A, B and C.

10. A method of decoding data from a ROM device comprising a set of memory points arranged in rows and columns, each memory point capable of storing two bits of data and comprising a single switch controllable to connect together first and second terminals of said switch, each of said first and second terminals being connected to one of first, second and third conductive lines, the method comprising the steps of:

connecting said second and third lines to a first voltage level;

storing a second voltage level on said first line;

activating one of said memory points; and detecting the voltage on said first line and determining a first bit of said data based on only the voltage detected on the first line.

* * * * *